United States Patent [19]
Miller

[11] Patent Number: 5,301,084
[45] Date of Patent: Apr. 5, 1994

[54] ELECTROSTATIC DISCHARGE PROTECTION FOR CMOS INTEGRATED CIRCUITS

[75] Inventor: William E. Miller, Los Gatos, Calif.

[73] Assignee: National Semiconductor Corporation, Santa Clara, Calif.

[21] Appl. No.: 748,119

[22] Filed: Aug. 21, 1991

[51] Int. Cl.⁵ .............................................. H02H 9/04
[52] U.S. Cl. ....................................... 361/91; 361/111; 361/56; 257/356
[58] Field of Search ...................... 361/91, 56, 58, 111; 257/357, 360, 361, 362

[56] References Cited

U.S. PATENT DOCUMENTS

| | | | |
|---|---|---|---|
| 4,423,431 | 12/1983 | Sasaki | 357/41 |
| 4,819,047 | 4/1989 | Gilfeather et al. | 357/23.13 |
| 4,930,036 | 5/1990 | Sitch | 361/56 |
| 4,962,320 | 10/1990 | Okada et al. | 361/111 |
| 4,990,802 | 2/1991 | Smooha | 307/482.1 |

FOREIGN PATENT DOCUMENTS 2227898  8/1990  United Kingdom .

OTHER PUBLICATIONS

Dialog Information Services, Inc. search of 25 Apr. 1991.

*Primary Examiner*—Todd DeBoer
*Attorney, Agent, or Firm*—Townsend and Townsend Khourie and Crew

[57] ABSTRACT

An electrostatic discharge ("ESD") protection circuit for use in CMOS I.C. devices provides a low voltage path to and from each input and output ("I/O") pad and power pad by using the wide, low resistance metal VCC and Vss rings and parasitic bipolar transistors configured as three terminal devices at each I/O and power pad. The present invention also provides a clamp, between the VCC and VSS rings, capable of being rapidly switched into the conducting state during an ESD event so as to shunt excess bias current that could otherwise damage reverse biased junctions during an ESD event.

19 Claims, 6 Drawing Sheets

ELECTROSTATIC DISCHARGE PROTECTION FOR CMOS INTEGRATED CIRCUITS

BACKGROUND OF THE INVENTION

All integrated circuit ("I.C.") devices are sensitive to ESD to some degree. However, as I.C. devices are made smaller, ESD damage is more likely to occur and render the device inoperable in response to an ESD event. Particularly susceptible are MOS and CMOS devices with thin gate oxides.

ESD results when electrostatic charge is collected and then rapidly discharged in a short duration, high voltage pulse. It has been shown that voltage potentials up to 28 kV can be generated and discharged in less than 10 nanosecond through an I.C. device when handled by a person. Electrostatic charge can also be accumulated on pin of the lead frame of a packaged I.C. device during shipping, storage or while being integrated into an electronic system which is discharged when another pin is grounded. The discharge of the high electrostatic voltage can result in a current of about two amperes. The high current must flow through the I.C. device when another pin or pad is grounded. MOS devices are particularly susceptible to discharge of the electrostatic charge because the thin gate oxide can be easily ruptured by the voltage induced by the high current.

The need for ESD protection in I.C. devices that can handle the high current produced by an ESD event has been recognized for many years. However, it is typical that ESD protection circuits are designed to provide protection against electrostatic charge levels of between 500 volts to 3.0 kilovolts because once the I.C. device has been inserted into a system, the need for ESD protection is minimized since most such systems generally incorporate sophisticated ESD protection. However, prior to insertion, I.C. devices are particularly vulnerable to ESD pulses applied to the I.C. device's pins or pads.

In a typical CMOS I.C. device, a supply voltage bus or ring, herein called the VCC ring, and a ground voltage bus or ring, herein called the VCC ring, are routed around the perimeter of the I.C. device. In some I.C. devices, the rings are concentric with one ring within the other although it is possible that the VCC ring is on a different conductive layer than the VSS ring.

One prior art protection scheme provides sufficient ESD protection to dissipate the electrostatic charge typically accumulated by a person which is typically about 2.0 kilovolts (often referred to as the human body model or "HBM"). HBM protection is achieved by placing standard size (W/L~150 μm/2 μm) N-channel or P-channel output drivers between every input and output ("I/O") pad and VSS or VCC rings, respectively. On input pads, the gate of each driver is resistively tied to the appropriate body of the semiconductor die.

To discharge accumulated charge between either the VCC or VSS rings, the prior art protection scheme used a passive clamp which is typically a standard size N-channel MOS transistor. The gate of the clamp transistor is connected to an ESD detector which may be either passive or active. The passive detector circuit typically consists of a resistor coupling the gate to VSS. Active clamp circuits consist of digital and analog components such as amplifiers and resistors and capacitors. The drain and source of the MOS transistor are connected to the VCC and VSS rings, respectively.

In order to handle the instantaneous current created by the ESD pulse, the VCC and VSS rings are typically 50 μm wide on the thickest metal layer. This protection scheme is widely used on MOS I.C. devices because the silicon area required for implementation is minimal. However, this protection scheme is effective primarily for CMOS processes with geometries greater than two microns having 400 Å thick gate oxide but is not effective for CMOS processes with smaller geometries and thinner gate oxides.

A circuit schematic of the above ESD protection network is shown in FIG. 1. A pad 12 is coupled to VCC ring 18 through PNP transistor 14 and pad 16 is coupled to VSS ring 22 through NPN transistor 20. The base and collector of transistors 14 and 20 are shorted together and tied to VCC ring 18 and VSS ring 22, respectively, which causes them to function as diodes. A resistor 24 may be coupled in series between the gate of transistor 26 and pad 12.

In the illustrated embodiment, in response to an two ampere ESD pulse, transistors 14 and 20 switch to the on-state in about one nanosecond and have approximately a positive five volt forward voltage drop across the emitter-base junction. As the base of NPN transistor 20 is formed from the P substrate, which is normally tied to the lowest potential (i.e., VSS), it is an obvious design choice to couple it to the VSS ring 22. For similar reasons of efficiency to keep the PNP off during normal operation, the base of PNP transistor 14 is tied to the highest potential (i.e., VCC).

Each I/O pad 12 and 16 also has a second transistor configured as a diodes 15 and 17 coupled between the pad and power rings 18 or 22, respectively. For example, in FIG. 1, diode 15 (an NPN transistor) couples pad 12 to VSS ring 22 and during an ESD event with a positive pulse, diode 15 is reverse-biased. One major design consideration for the ESD protection circuit of FIG. 1 is to avoid forcing ESD current through a device in the reverse direction. In most CMOS processes, a reverse biased PNP transistor has reverse breakdown voltage of about 18 volts and an NPN transistor's reverse breakdown voltage is about 15 volts with a snapback to about 10 volts. In either case, if the transistors of the CMOS device use a polysilicon gate and see a drain to source voltage greater than 10 volts with a simultaneous gate to source voltage greater than 10 volts for more than 50 nanoseconds, sufficient hot carriers (i.e., carriers having an energy higher than that of majority carriers normally encountered in the same material) could be generated which would rupture the gate oxide and short the gate of one or more transistors on the I.C. device. It is well known that N-channel devices are much more susceptible to damage from the application of a high amplitude voltage across its drain and source simultaneous with the application of a high amplitude voltage across its gate and source than are P-channel devices. Thus, a drain to source. $V_{DS}$, voltage greater than 10 volts with a simultaneous gate to source voltage, $V_{GS}$, greater than 10 volts for more than 50 nanoseconds could easily generate sufficient hot electrons to rupture a 300 Å gate oxide. Even without the simultaneous application of high amplitude $V_{GS}$ and $V_{DS}$, the gate oxide is susceptible to rupture at approximately 17 volts. Such devices would then be inoperative or damaged to the extent that each would soon fail.

In FIG. 2, a functional schematic of the ESD protection network shown in FIG. 1 is provided. A typical ESD event at pad 12 "sees" a voltage rise over the first PNP transistor 14, modeled as a diode, a voltage rise due to the resistance of the VCC ring 18, modeled as a resistor 34, a voltage rise across clamp 32, a voltage rise across the resistance of VSS ring 22, modeled as resistor 36, and a voltage rise across NPN transistor 20 modeled as a diode. During the ESD event, the aggregate voltage rise can be greater than 17 volts which can reverse-biased diodes 15 or 17 (FIG. 1) and stress the gate oxide of the I.C. device. Since any voltage over 17 volts will exceed the reverse breakdown voltage for the NPN diodes, a current path will flow from the I/O pin through the reverse-biased diode and into either the VSS or VCC ring. Thus, the aggregate voltage caused by the ESD event can destroy the gate oxide of the reverse-biased diode.

With typical MOS processes, gate dimensions of two microns, gate oxide thickness of 400 Å and no lightly doped drain (LDD) regions are common design parameters. In such designs, the gate oxide is sufficiently thick such that it will require the voltage across the circuit of FIG. 2 to see at least a 20 volt rise before the oxide will rupture. The prior art protection circuit of FIGS. 1 and 2 was more than adequate because the gate oxide rupture voltage was higher than the sum of the voltage drops across the series elements in the ESD current path.

The prior art protection schemes are sufficient to protect CMOS I.C. devices having the geometries of the typical MOS processes. However, as device geometries are scaled down, gate oxides become thinner and as LDD are now required for many applications, such I.C. devices become susceptible to ESD damage at lower voltages. To rely on the reverse biased diodes of FIGS. 1 and 2 to limit the voltage rise caused by electrostatic discharge is clearly insufficient.

The possibility of such reverse-biasing in the illustrated ESD protection circuit of FIG. 1 is known. One brute force solution to limit the voltage rise is to make each component in the ESD protection circuit larger. However, this approach uses up valuable area on the I.C., making it prohibitively expensive. Moreover, while this solution improves the forward bias component resistance at the expense of a much greater amount of surface area, it only slightly improves the reverse bias breakdown level.

In addition to the above, the circuit of FIG. 1 provides only a path to VCC for positive ESD spikes and a path to VSS for negative ESD spikes. Other paths looking at FIG. 2, must go through clamp 32 usually in the reverse direction. Since clamp 32 requires a voltage in excess of about 15 volts to conduct in the reverse bias state, such paths will degrade or damage the I.C. device. Clearly as CMOS gate oxide become thinner, it is necessary to provide additional paths from one I/O pad to another I/O pad and not just to the VCC and VSS rings.

Other known solutions to this problem have also not been fully satisfactory, leaving a need for an effective ESD protection circuit using minimum I.C. area.

SUMMARY OF THE INVENTION

This invention is broadly related to integrated circuit (I.C.) devices. More specifically, it relates to electrostatic discharge ("ESD") protection circuits used in CMOS I.C. devices.

The present invention provides a low voltage path to and from each input and output ("I/O") pad by using the low resistance metal VCC and Vss rings to shunt current from the charged I/O pad to an I/O pad that is at ground potential. The present invention also provides a clamp, between the VCC and VSS rings, capable of being rapidly switched into the conducting state at a lower voltage when reverse biased during an ESD event. The clamp is then able to shunt current to a low impedance power bus that could otherwise damage reverse biased junctions during an ESD event.

In a preferred embodiment, the present invention comprises an ESD protection circuit provided on the I/O and power pads of a CMOS I.C. device. The protection circuit provides a plurality of low voltage paths to and from VCC or VSS that may be rapidly switched to a low impedance state.

The present invention prevents ESD damage to CMOS I.C. devices where the minimum geometry and gate oxide thickness are reduced is about 300 Å or less and N-channel are designed to take advantage afforded by LDD. ESD damage is greatly reduced because the extent or magnitude of the voltage is limited and reverse bias stress of the junctions is correspondingly reduced. For example, for a typical MOS process having minimum geometry of 1.5 microns and gate oxide thickness of 300 Å or less, it is common for the gate oxide to rupture at about 17 volts or less. At this low voltage, the reversed biased P-channel protection devices of FIG. 2 are not yet conducting in the avalanche region and, although the N-channel protection devices, which trigger at about 15 volts and snap back to 10 volts, are conducting, the N-channel devices will rupture if stressed to 15 volts.

The present invention includes four ESD circuit design enhancements so as to increase protection against electrostatic charge damage while still maintaining the silicon area used exclusively for ESD to a minimum. Rather than coupling in the manner described in the prior art embodiment of FIGS. 1 and 2, the parasitic bipolar transistors comprising the ESD protection circuit of the present invention are treated as three terminal devices. Specifically, the emitters are coupled to the I/O pads, the base is coupled to the lowest VSS or highest VCC ring, as appropriate, and the collector is coupled to the complementary ring.

The present invention allows significant amounts of ESD current to bypass the clamp and its voltage drop, thereby reducing the chance of destroying reverse-biased junctions or gate oxide. Use of the present invention limits overstress between any two pads on the I.C. device. Also, this arrangement reduces the area needed for the ESD rings since each ring sees less current for a given ESD event. In effect, the transistors and rings in the protection circuit function as two parallel resistances during a given ESD event.

In addition to the clamp between the VCC and VSS rings, a capacitor is added in parallel with the drain and source of the clamp. The capacitor provides added protection against accumulated charge on an I/O that is discharged directly through one of the VCC or VSS pads because the three terminal device on the I/O pad is immediately biased in the on-state by base current flowing through this capacitor.

Finally, in addition to the above discussed capacitor, the clamp is also preferably modified by coupling a capacitor between the drain and gate of the clamp transistor. The capacitor reduces the voltage necessary to trigger reverse breakdown on the clamping transistor and consequently reduces both the total voltage drop seen by the ESD protection circuit and the time required to switch the clamp into the current passing state.

The invention will now be described with reference to the drawings.

DESCRIPTION OF THE SPECIFIC EMBODIMENT(S)

Figure 1:
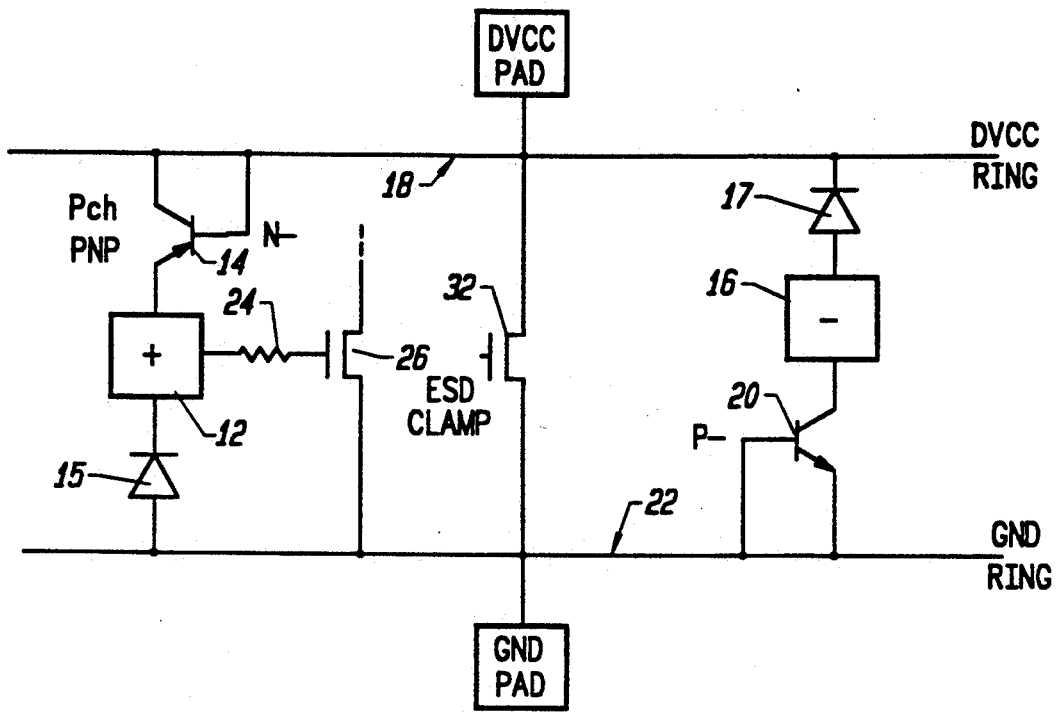
FIG. 1 is a schematic of a known ESD protection circuit.

In the description that follows, the present invention is described in combination with insulated gate field effect transistor technology, such as CMOS, fabricated on a P-type substrate. It should be understood that the present invention may be implemented in combination with any MOS integrated circuit technology or substrate type. In the description of the embodiments, like elements are described throughout with like reference numerals.

Figure 3:
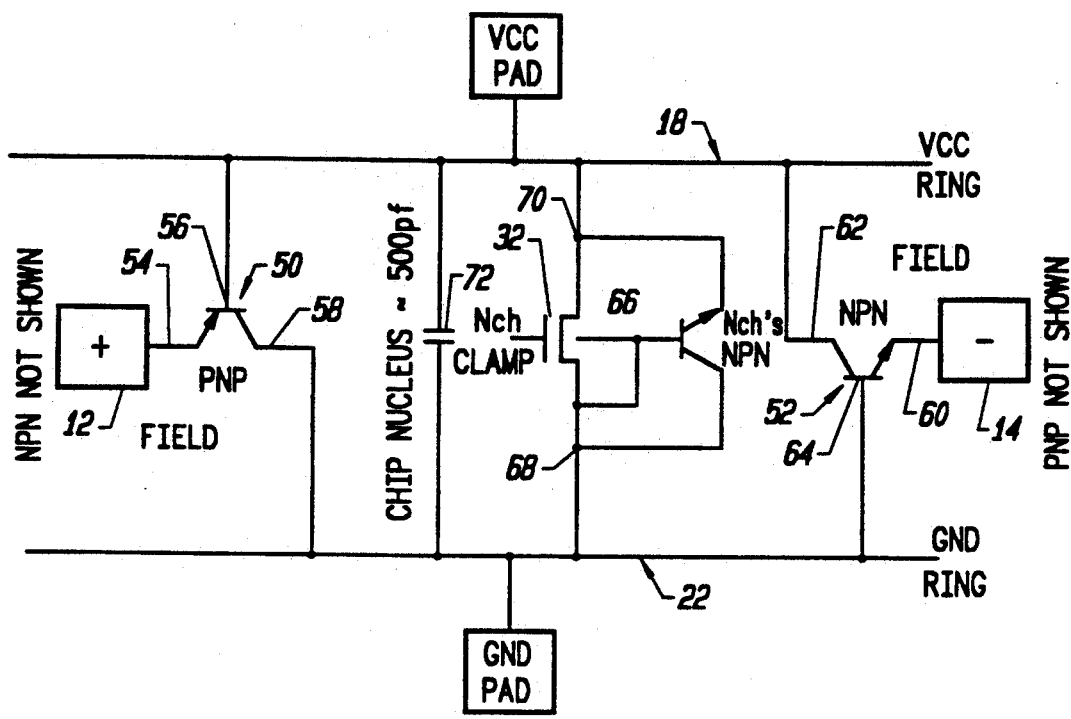
FIG. 3 is a schematic of a first embodiment of the present invention.

Referring now to FIG. 3, one embodiment of the ESD protection circuit of the present invention employs parasitic PNP and NPN transistors 50 and 52, respectively, to rapidly discharge an electrostatic charge at one I/O pad when another pad is grounded.

In the circuit of FIG. 3, PNP transistor 50 is connected in a three terminal configuration with an emitter 54 connected to pad 12, a base 56 connected to VCC ring 18 and a collector 58 connected to VSS ring 22. In a similar manner, NPN transistor 52 is connected as a three terminal device with emitter 60 connected to pad 14, collector 62 connected to VCC ring 18 and base 64 coupled to VSS ring 22.

It will be understood by one skilled in the art that, although not explicitly shown, an NPN parasitic transistor (not shown) is connected to pad 12 in a manner similar to the connection of transistor 52 and an PNP parasitic transistor (not shown) is connected to pad 14 in a manner similar to the connection of transistor 50. Further, one skilled in the art will understand that each lateral transistor is a symmetrical device and designation of the emitter and collector is a matter of convenience.

The circuit of FIG. 3 further includes a clamp transistor 32 and a capacitor 72 that is dependant on the size of the nucleus of the I.C. device. Clamp 32 has its drain connected to VCC ring 18 and its source to VSS ring 22. A parasitic, lateral bipolar transistor 66 is associated with the MOS transistor of clamp 32. Transistor 66 has its base and collector coupled to the source of the clamp 32 transistor at node 68. It being understood that the base of transistor 66 is further connected to the substrate body. The emitter of transistor 66 is coupled to the drain of the clamp 32 transistor at node 70.

As noted above, VCC ring 18 and VSS ring 22 are coupled by capacitor 72. Capacitor 72 is preferably a distributed capacitance obtained from the nucleus of the I.C. device. In this manner, sufficient capacitance may be provided without necessitating the allocation of additional surface area of the I.C. device to construct a large area capacitor. At the high current experienced during an ESD event, the $\beta$eta ($H_{FE}$) of the transistors are relatively low so it is important that capacitor 72 is sufficient to provide sufficient base drive to keep transistor 66 in the on-state. The value of capacitor 72 is preferably at least 330 picofarads for a 100×100 mil MOS I.C. device and is dependant on the number of transistors in the nucleus of the I.C. device.

Figure 2:
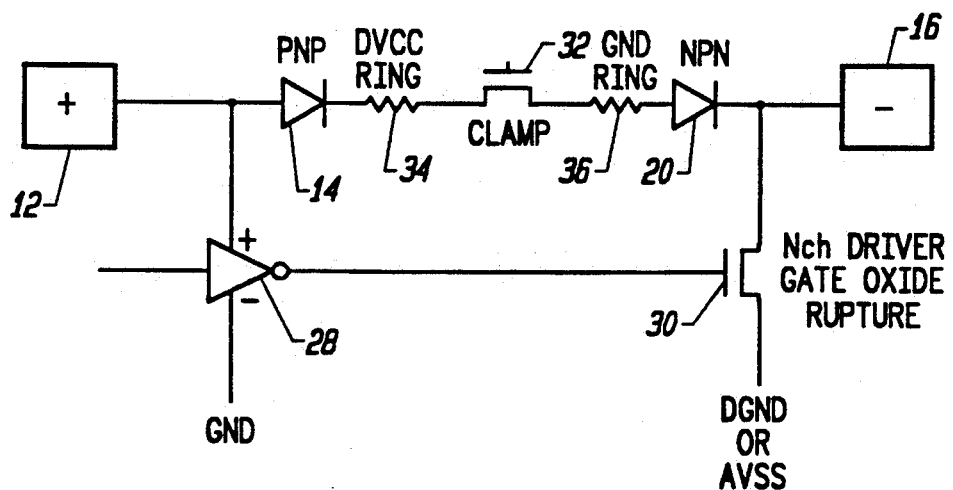
FIG. 2 is a simplified schematic of the circuit of FIG. 1.
Figure 4:
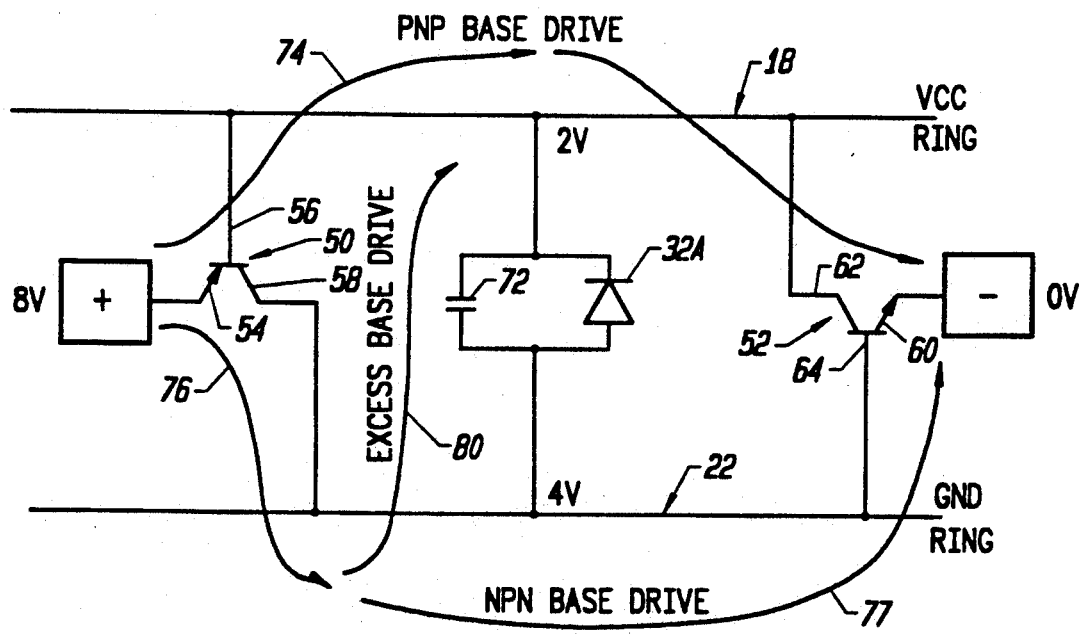
FIG. 4 illustrates ESD current flow paths through the circuit illustrated in FIG. 3.

With the three terminal connection disclosed in FIG. 3, substantial amounts of the current generated during an ESD event may bypass clamp 32 and the voltage drop associated therewith. As shown in FIG. 4, a positive ESD event at pad 12 forward biases the emitter 54—base 56 junction so that current will flow from pad 12 to VCC ring 18 through base 56 as is indicated by path 74. Current will also flow along path 76 from pad 12 through emitter 54 and collector 58. However, as opposed to the embodiment of FIG. 2 where the entire current was forced to flow through the passive clamp until the avalanche region is reached, the current of the present embodiment flows primarily on VCC ring 18 directly to pad 14 through the low resistance collector 62 to emitter 60 path of forward biased transistor 52.

Transistor 50 conducts sufficient current along path 76 so as to maintain transistor 52 in the forward biased state. Excess current from path 76 will be shunted back to VCC ring 18 through the now forward biased NPN transistor 66 of MOS clamp 32. However, the current through clamp 32 along path 80 is considerably lower in the present embodiment than in the prior art embodiment of FIG. 2. Clamp 32 must now simply provide a path to discharge excess base drive current from VSS ring 22 onto VCC bus 18. In this manner, excess base drive is shunted from VSS ring 22 onto VCC bus 18 and safely dumped through the forward-biased collector 62—emitter 60 junction of transistor 52 to pad 14.

One advantage of using the three terminal configuration of the present invention is that the area required for VCC ring 18 and VSS ring 22 is minimized. For example, with the three terminal configuration of FIG. 3, the VSS ring 22 "sees" about 25% of the ESD current and may be correspondingly designed to have a lower current carrying capability than would otherwise be necessary.

Figure 5:
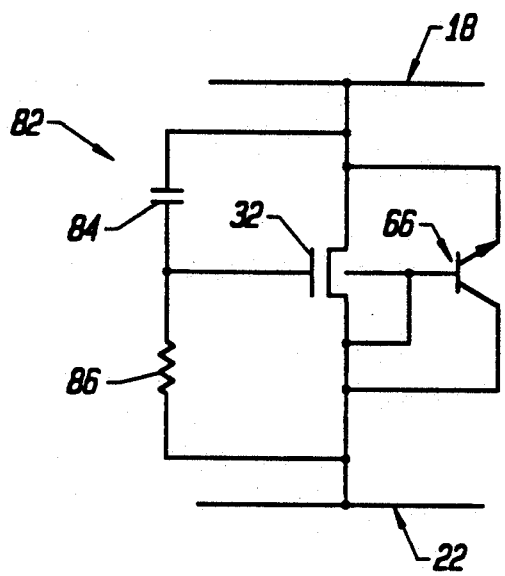
FIG. 5 illustrates one embodiment of an improved passive clamp circuit that lowers the reverse turn-on voltage level.

Referring now to FIG. 5, one preferred passive embodiment of clamp 82 is shown in greater detail. In addition to transistor 32, a kick-start capacitor 84 connects the gate of transistor 32 to VCC and the drain of transistor 32. Capacitor 84 kick-starts transistor 32 when in the reverse bias mode. As is common with passive clamps, resistor 86 couples the gate of transistor 32 to VSS and the source of transistor 32.

During normal operation of the I.C. device, the gate-source voltage of transistor 32 is zero volts. However, when an ESD pulse occurs, the voltage rise is coupled by capacitor 84 to the gate causing the gate-source voltage to rapidly increases to about one to two volts for about 1 to 5 nanoseconds. Capacitor 84 instantly kick-starts transistor 32 to switch to the 10 volt reverse breakdown state as is shown in FIG. 6.

Figure 6:
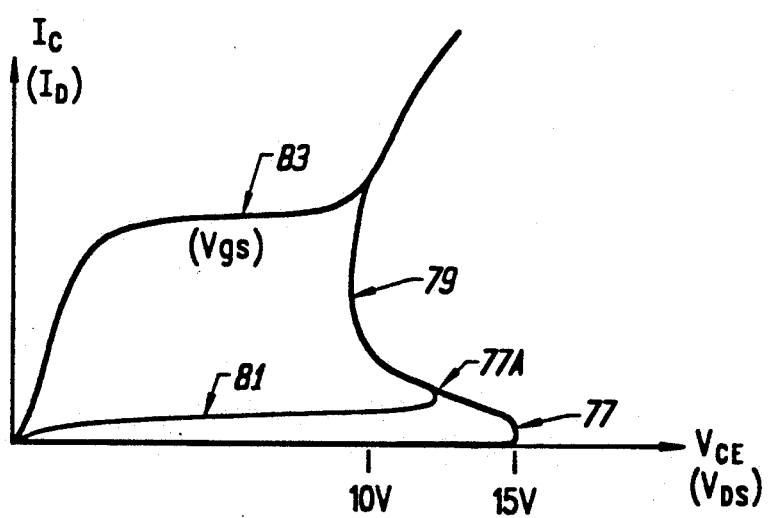
FIG. 6 is a plot of the response of N-channel NPN transistor operation during an ESD event.

In FIG. 6, without kick-start capacitor 84, the voltage across the base-collector region of transistor 66 must increase to about 15 volts before any conduction occurs. As soon as current begins to flow a rapid multiplication of charge tends to cause a rapid decrease in the voltage as indicated by the knee 77 of curve 79. The knee 77 indicates the base-collector avalanche region where holes travel across through the base region and electrons flow into the collector. The voltage will continue to decrease until the gain of transistor 66 falls off at higher current levels. The portion of the curve designated 81 indicates the conduction mode if the value of capacitor 84 is insufficient. As shown in FIG. 6 there is a small amount of current flow at very low Vds voltages but the knee 77A does not occur until the voltage has increased to more than 12 volts.

When capacitor 84 is properly sized, the MOS device is switched into the conducting region and conducts less than a milliampere of source current. That source current, in turn, provides base drive to the bipolar transistor. The bipolar transistor's emitter current can then rapidly (i.e., within one to two nanosecond) increase to as much as one or two amperes as is indicated by the portion of the curve designated 83. In the preferred embodiment, capacitor 84 is sufficient to provide a gate drive voltage of one to two volts on the gate of transistor 32 and a drain current of about one to two milliamperes.

Capacitor 84 can be built in a small area to provide the necessary kick-start. Further, in the preferred embodiment, transistor 32 need only have a width of 150 $\mu$m and a length of 1.5 $\mu$m because of the rapid kick-start provided by capacitor 84.

Figure 7:
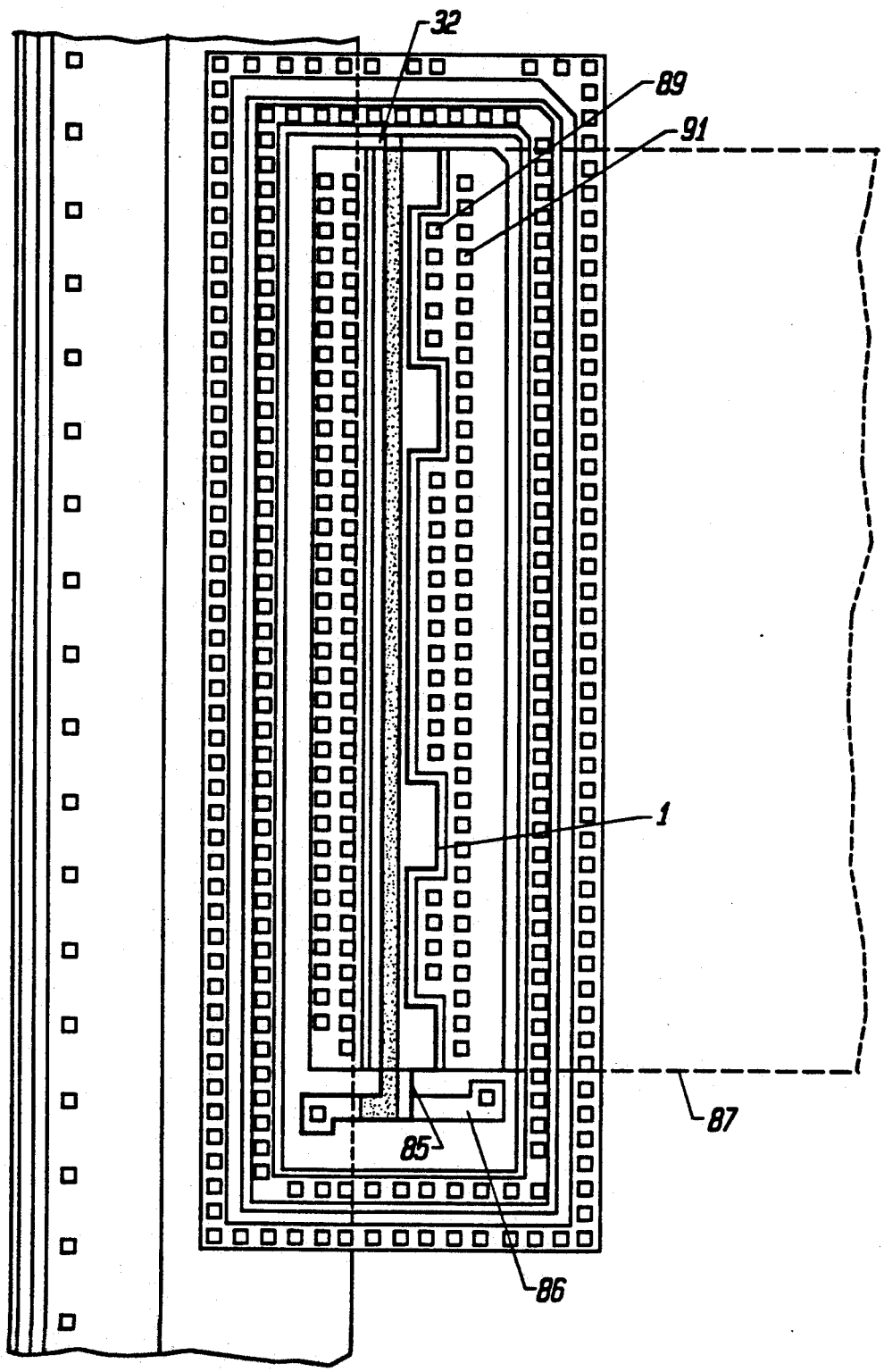
FIG. 7 is a topological view of the passive clamp of FIG. 5.

As shown in FIG. 7, resistor 86 is a diffusion resistor, preferably about 10K ohms, connected to ground the source of transistor 32. Capacitor 84 is a stacked capacitor constructed from a first conductive plate 85 overlapping the N+ source diffusion of transistor 32 and a second conductive plate 87 overlapping the first conductive plate 85. A first oxide layer or dielectric (not shown) is disposed between the diffusion region and the first plate 85 and a second oxide layer acts as the dielectric for the portion of the capacitor formed by plates 85 and 87. The second conductive plate 87 and the N+ region of transistor 32 are tied together as part of the drain interconnectivity by a series of vias 89 and contacts 91. The capacitive value required to kick-start transistor 32 is less than 100 femtofarads and is preferably about 25 femtofarads.

This provides a kick start (of base current from holes generated by hot electron channel current) to the N channel's intrinsic parasitic NPN bipolar device which lowers this ESD device's reverse bias turn on voltage from 15 volts to 10 volts. Also, the gate of the N-channel transistor is kept in the on-state for only a short duration so that the gate oxide is not worn out (ruptured) from hot electron injection.

With the addition of capacitor 84, the bipolar action of the parasitic transistor 66 (FIG. 3) associated with transistor 32 is initiated at a lower voltage. Without the kick-start capacitor 84, it is not possible to prevent 15 volts from being added to the other ESD voltage drops. The voltage drop across the clamp alone is enough to cause gate oxide rupture. With the 10 volt breakdown of the present invention, the stress on the gate oxides has been reduced by about five volts even with the small area parasitic clamp design and gate oxides of 300 Å or less. Without capacitor 84, an active clamp would be required with a significant penalty in area devoted to ESD protection. One such active clamp is disclosed in commonly owned U.S. application Ser. No. 07/452879, Dec. 19, 1989, the disclosure of which is incorporated herein.

Lower voltage initiation of the bipolar transistor action is especially important as the dimensions of CMOS devices shrink because the density of the electric field increases at the edges of each gate. Further, as gate oxides become thinner, the gate oxide will break down or rupture at lower voltages than do relatively thicker gate oxides.

In many of modern CMOS I.C.s, multiple VCC rings 18 and VSS ring 22 are provided in order to separate circuit logic that switches large amounts of current from circuit logic that switches relatively small amounts of current. It is thus quite common to provide a nucleus power buss, VCC 18A, and a driver power bus DVCC ring 18B. Similarly, VSS ring 22 is split into a nucleus VSS ring 22A and a driver DVSS ring 22B. The voltage rings 18B, 22A and 22B are preferably on the thickest metal layer which is usually top layer metal. VCC bus 18A need not be a ring and accordingly may be on a thinner metal layer such as the first metal level.

Figure 8:
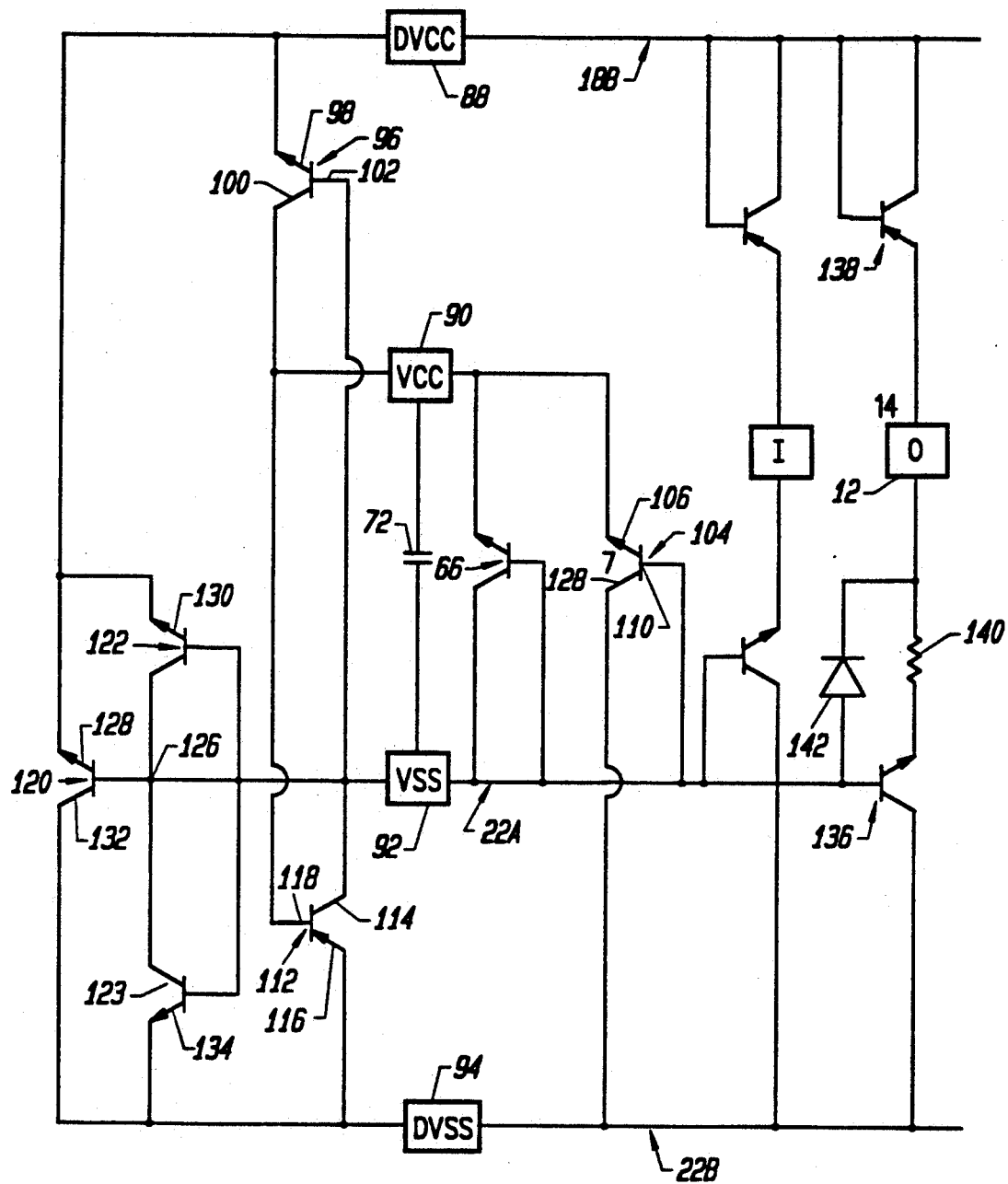
FIG. 8 is a schematic of a second embodiment of the present invention.

FIG. 8 discloses another embodiment of the present invention with multiple power and ground paths. To prevent a DVSS potential bounce (caused by L di/dt=iR) from being coupled to the VSS pad, a simple forward diode between the DVSS and VSS rings is not sufficient for ESD protection. Also, the I/O pad's protection is complicated by the N channel's source no longer being connected to its body so that its parasitic NPN will not have sufficient base drive for forward conduction operation upon an ESD event.

These problems are solved by connecting a lateral PNP device (transistor 112), between the DVSS and VSS with its base tied to VCC. Under normal operating conditions transistor 112 is in the off-state and never couples DVSS with VSS. However, when an ESD event occurs, transistor 112 switches into the on-state since it can be provided sufficient base drive from the chip's nucleus capacitance 72 connected to its base.

In FIG. 8, as in the embodiment of FIG. 3, VCC 18A is coupled to VSS 22A by capacitor 72 and clamp 32. One skilled in the art will understand that each parasitic bipolar transistor is associated with a related MOS device that provides a capacitive kick start when current has to flow in the direction opposite from that shown by the emitter arrow in the drawings. Further, one skilled in the art will understand that the lateral parasitic transistor is a symmetrical device and designation of the emitter and collector is a matter of convenience.

In the embodiment of FIG. 8, each power pad 88, 90, 92 and 94 has ESD protection. For example, an ESD event on VCC ring 18A could be discharged through the DVCC ring 18B by NPN transistor 96 that has its emitter 98 connected to DVCC ring 18B at pad 88, its collector 100 connected to VCC ring 18A at pad 90 and its base 102 connected to VSS ring 18A at pad 92.

Similarly, a three terminal ESD circuit couples VCC ring 18A to VSS and DVSS rings 22A and 22B by a parasitic transistor 104 which is preferably NPN. Specifically, the emitter 106 of transistor 104 is coupled to VCC ring 18A at pad 90, the collector 108 is coupled to DVSS ring 22B at pad 94 and the base 110 coupled to VSS 22A.

In like manner, an ESD device, transistor 112 (preferably a lateral PNP transistor whose base is the N-well with field oxide between emitter and collector), couples VSS ring 22A and DVSS ring 22B. Specifically, collector 114, emitter 116 and base 118 of transistor 112 connect to VSS ring 22A, DVSS ring 22B and VCC ring 18A, respectively.

Transistors 66, 96, 104 and 112 are located or built adjacent pad 90 because the VCC bus need not be in the ring configuration. However, one skilled in the art will understand that each ring 18B, 22A and 22B could have more than one pad to which bonds to the lead frame are made in which instance it may be preferable to connect a plurality of smaller area transistors adjacent to each pad of VCC ring 18A.

Additional ESD protection is provided by transistors 120, 122 and 123 all of which are preferably NPN kick-start parasitic transistors. In typical CMOS processes using a P-type substrate and N-type wells, it is required that all NPN transistors have the base connected to substrate which is generally maintained at the lowest potential or VSS to ensure junction isolation under normal operating conditions.

In FIG. 8, the base and collector of transistors 122 and 123 are connected to the base of transistor 120 at node 126 which corresponds to VSS ring 22A. The emitters 128 and 130 of transistors 120 and 122, respectively, are each coupled to DVCC ring 18B while the collector 132 of transistor 120 and emitter 134 of transistor 123 are coupled to DVSS 22B. Preferably, transistors 120, 122 and 123 are preferably distributed around the periphery of the I.C. device.

Finally, additional ESD protection is provided at the I/O pad 12 or 14 by transistors 136 and 138 illustrated as an output pad having the drain resistor and guard ring diode instead of a kick-start transistor. Transistors 136 and 138 are the parasitic bipolar transistors associated with the MOS output devices which saves having to build additional special three terminal NPN and PNP devices.

In this embodiment, the MOS output driver's parasitic bipolar is simply utilized. Special arrangement is made to get base drive to transistor 136 through transistor 112 and nucleus capacitance 72. Transistor 138 is configured as a diode to DVCC ring 18B and is preferably a PMOS pullup driver. Transistor 136 is illustrated for a NMOS pulldown driver with a drain resistance 140. A parasitic diode 142 couples the base of transistor 136 to the I/O pad and effectively protects N-channel output drivers which utilize resistor 140.

Figure 9:
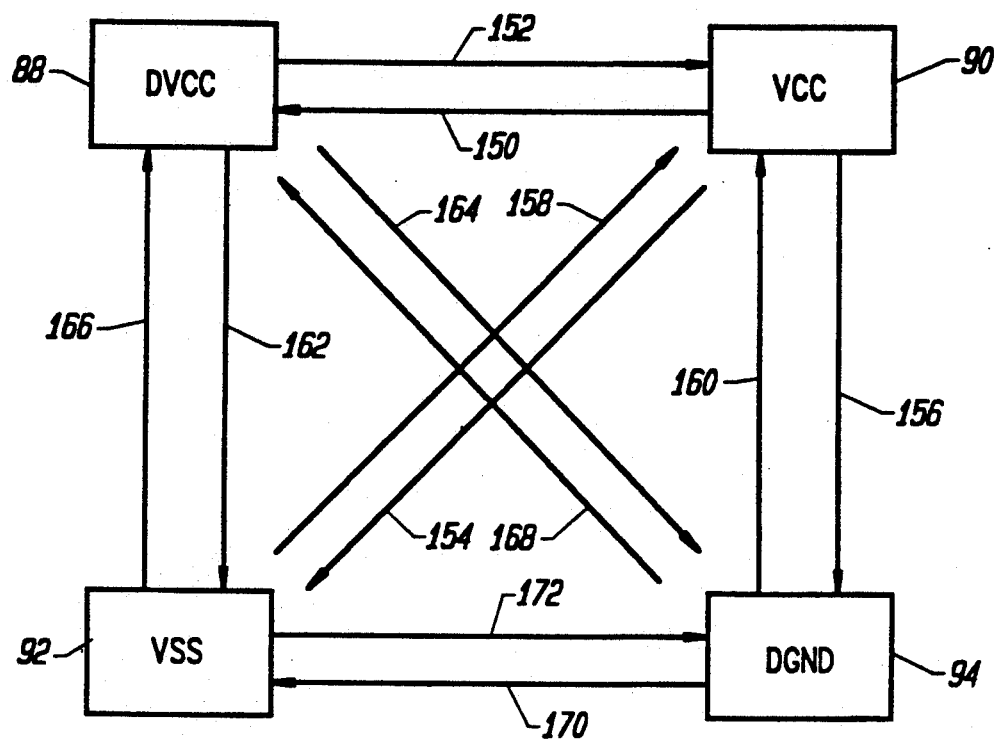
FIG. 9 is a current flow diagram depicting possible current paths during an ESD event for the embodiment of the present invention shown in FIG. 7.

The interaction of transistors 66, 96, 104, 112, 114, 120, 122 and 123 may be best understood by reference to FIG. 9. When an ESD event is applied to one ring, such as VCC ring 18A, it is desirable to shunt the current through either DVCC ring 18B, VSS 22A or DVSS 22B. For example, in order to shunt current from VCC 18A to DVCC ring 18B during a positive ESD pulse applied to VCC at pad 90, transistor 96 will be forward biased with base current provided by capacitor 72 (FIG. 8) and current will flow along path 150 to pad 88. If the ESD pulse is negative, current will flow along path 152 through transistor 96 in the reverse direction with respect to the arrow that designates the emitter of transistor 96, so transistor 96 kick-start capacitor will by utilized.

The positive ESD pulse could also be shunted from VCC to VSS ring 22A (pad 92) along path 154 by kick-starting transistor 66 into its conducting mode. Alternatively, the pulse could be shunted to DVSS ring 22B (pad 94) along path 156 by kick-starting transistor 104. Negative ESD pulses could be shunted to VSS ring 22A along paths 158 and 160. In this mode transistor 66 is forward biased along path 158 and transistors 112 and 104 are forward biased along path 160 with device 112 providing base drive to device 104 and capacitor 72 providing base drive to device 114.

If the positive ESD event were applied to DVCC ring 18B, transistor 122 will be reversed kick started as indicated by path 162. Transistor 120 will also be reversed kick biased as indicated by path 164. For a negative pulse, transistor 122 will be forward biased as indicated by path 166 as will transistors 96 and 112 as indicated by path 168.

Finally, it is possible that an ESD event could be applied to either the VSS ring 22A or the DVSS ring 22B. If pad 92 is positive relative to pad 94, transistor 123 is forward biased as indicated by path 172. If however, pad 94 is higher, transistor 112 is forward biased and transistor 123 will be reversed biased as indicated by path 170. Base current to forward biased transistors 112 is provided by capacitor 72.

The kick-start capability of capacitor 84 ensures that ESD protection devices switch at 10 volts instead of 15 volts into the reverse breakdown state and shunt damaging current to another properly biased bus. The use of capacitor 84 kick-starts or triggers snapback reverse breakdown of bipolar ESD protection transistors at a reduced voltage stress condition (FIG. 6). With capacitor 84, actual stress to the protection transistors and the circuitry of the I.C. circuitry is limited.

Each MOS device provides a capacitive kick-start for its associated bipolar parasitic device. The capacitive kick insures the bipolar device rapidly snaps back into its reverse conductive region upon stress in the reverse direction.

Typically, additional gate-drain capacitance, $C_{gd}$, added by the first metal to N+ diffusion and metal 2 is approximately 10-40 femtofarads while gate-source resistance $R_{gs}$ typically range between 5k-20k ohm.

For a CMOS process having a width to length ratio of about 112 to 1.5 and a gate oxide thickness of 300 Å or less, $C_{gd}$ is approximately one-tenth the gate-source capacitance, $C_{gs}$, and therefore, the capacitance triggers snap-back reverse breakdown of the bipolar ESD protection transistors at about two times the power supply voltage since the typical CMOS I.C. device power rings VCC 18A and DVCC 18B are about 5.0 volts. The RC time constant for typical CMOS I.C.s provides about a two nanosecond time constant which is sufficiently less than the 10 nanoseconds required to avoid gate oxide damage or stress.

Capacitor 72 includes N-well diffusion-to-substrate diode capacitance in addition to about half of the gate oxide capacitance associated with nucleus logic. The capacitance associated with the nucleus logic is one half the normally expected value because if the logic device is OFF then no capacitance is provided. However, half of the nucleus logic devices are in the on-state and current flow through ON devices will charge the capacitance associated with their gates. In typical applications, capacitor 72 is greater than 300 picofarads but could range over 500 picofarads.

It is understood that the above description is intended to be illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. In a CMOS semiconductor device, a circuit for preventing damage to said device from electrostatic discharge comprising:
   a semiconductor substrate of a first conductivity type;
   a first and a second spaced conductive ring disposed on the top surface of said semiconductor substrate; said first and second rings electrically coupled by a capacitor;
   first and second signal pads;
   a three-terminal NPN transistor for passing electrostatic discharge current to said first pad from said first conductive ring; said NPN transistor having an emitter connected to said first pad, a collector connected to said first conductive ring and a base connected to said second conductive ring;
   a three-terminal PNP transistor for passing electrostatic discharge current from said second pad to said second conductive ring; said PNP transistor having an emitter connected to said second pad, a collector connected to said second conductive ring and a base connected to said first conductive ring whereby the base and collector of said NPN and said PNP transistors are connected in parallel with said coupling capacitor; and
   a clamp circuit electrically coupling said first and second rings, said clamp circuit including
   an electrostatic discharge detector; and
   a MOS transistor of a second conductivity type having a drain coupled to said first ring and a source connected to said second ring; said MOS transistor having a parasitic bipolar transistor having a base of said first conductivity type coupling said source and said drain; and
   a quick start capacitor for said MOS transistor comprising a first conductive plate overlapping the source diffusion of said MOS transistor; a second conductive plate overlapping said first conductive plate; a first dielectric layer between said first conductive plate and said diffusion; and a second dielectric layer between said first and second conductive plates so as to form a stacked capacitor.

2. The semiconductor device of claim 1 wherein said first and second rings are disposed substantially proximate to the perimeter of said semiconductor substrate.

3. The semiconductor device of claim 1 wherein said capacitor provides base drive for said transistors upon electrostatic discharge.

4. The semiconductor device of claim 3 wherein said NPN and said PNP transistors limit the voltage rise during electrostatic discharge to between 8 volts and 12 volts.

5. The semiconductor device of claim 3 wherein said NPN and said PNP transistors limit the voltage rise during electrostatic discharge to about 10 volts.

6. The semiconductor device of claim 1 wherein said NPN transistor comprises a lateral parasitic NPN transistor and said PNP transistor comprises a lateral parasitic PNP transistor.

7. The clamp circuit of claim 1 wherein said substrate is P-type; said MOS transistor is an enhancement-mode MOSFET; and said bipolar transistor is a lateral parasitic NPN transistor, associated with said MOS transistor, having its base and collector electrically connected to said source and said second ring and its emitter electrically connected to said drain and said first ring.

8. The semiconductor device of claim 1 wherein a plurality of contacts and vias connect said second conductive plate and said diffusion region.

9. The semiconductor device of claim 8 wherein said capacitor has a value sufficient to kick-start said bipolar transistor associated with said MOS transistor.

10. The semiconductor device of claim 9 wherein said capacitor has a value of about 25 femtofarads.

11. In a CMOS circuit formed on a semiconductor substrate of a first conductivity type, said circuit having a first power ring and a second power ring; a circuit means for shunting high current between said power rings comprising:
    a MOS transistor having a drain coupled to said first power ring, a source coupled to said second power ring and a parasitic, lateral bipolar transistor having its base and collector coupled to the source of said MOS transistor and its emitter coupled to the drain of said MOS transistor;
    a resistor coupled between the gate of said MOS transistor and said second power ring; and
    a capacitor coupled between the gate of said MOS transistor and said first power ring, said capacitor comprising a first conductive plate overlapping the source diffusion of said MOS transistor; a second conductive plate overlapping said first conductive plate; a first dielectric layer between said first conductive plate and said diffusion; and a second dielectric layer between said first and second conductive plates so as to form a stacked capacitor.

12. The capacitor of claim 11 wherein said capacitor has a capacitance less than 100 femtofarads.

13. In a semiconductor device, a clamp for coupling a VCC ring and a VSS ring during an electrostatic discharge event comprising:
    a resistor;
    a capacitor, said capacitor comprising a first conductive plate overlapping the drain diffusion of said MOS transistor; a second conductive plate overlapping said first conductive plate; a first dielectric layer between said first conductive plate and said diffusion; and a second dielectric layer between said first and second conductive plates so as to form a stacked capacitor;
    a lateral bipolar transistor having a first terminal connected to VCC, a second terminal connected to VSS and a base coupled to substrate; and
    A MOS transistor having a drain coupled to VCC, a source coupled to VSS, a body and a gate; said gate coupled to VCC by said capacitor and to VSS by said resistor whereby the body of said MOS transistor has a low resistance connection to the base of said bipolar transistor and whereby said capacitor kick-starts said bipolar transistor into conducting current, induced by said electrostatic discharge event, at a low non-destructive breakdown voltage.

14. The circuit of claim 13 wherein said resistor has a value of about 10 kilo-ohms.

15. In a CMOS semiconductor device, a circuit for preventing damage to said semiconductor device by an electrostatic discharge event comprising:
a semiconductor substrate of a first conductivity type;
a power bus (VCC);
a first (VSS), a second (DVCC) and a third (DVSS) spaced conductive ring disposed on the top surface of said semiconductor substrate; said bus and said first ring electrically coupled by a capacitor (72) and a first clamp means (66); said first and second rings coupled by a second clamp means (122); said first and third rings coupled by a fourth clamp means (123); said bus further coupled to said first and third rings by a first lateral transistor (104) of a second conductivity type where said lateral transistor has a collector connected to said third ring, a base connected to said first ring and an emitter connected to said bus; said first ring further coupled to said second and third rings by a second lateral transistor (120) of said second conductivity type where said second lateral transistor has a collector connected to said third ring, a base connected to said first ring and an emitter connected to said second ring;
a first lateral transistor (112) of said first conductivity type having an emitter connected to said third ring, a collector connected to said first ring and a base connected to said bus; and
a third lateral transistor (96) of said second conductivity type having an emitter connected to said second ring, a collector connected to said bus and a base connected to said first ring; said capacitor adapted to provide base current to forward bias said first, second, third and fourth clamp means said first, second and third lateral transistors of said second conductivity type and said first lateral transistor of said first conductivity type during an electrostatic discharge event to ensure that each clamp and transistor switches either into the forward conducting mode conducting substantially upon initiation of said electrostatic event whereby said first lateral transistor of said first conductivity type provides base drive to said lateral transistors of said second conductivity type through said substrate, or into reverse kick-start mode whereby said transistor conducts in the reverse breakdown region substantially upon initiation of said electrostatic event.

16. The semiconductor device of claim 15 further comprising:
an input pad having a first electrostatic protection circuit means connected to said second ring for protecting against positive electrostatic events at said input pad; and a fourth lateral transistor of said second conductivity type having an emitter connected to said input pad, a collector connected to said third ring and a base connected to said first ring; and
an output pad having a second electrostatic protection circuit means connected to said second ring for protecting against positive electrostatic events at said output pad; and a fifth lateral transistor of said second conductivity type having its emitter resistively coupled to said output pad, its base connected to said first ring and its collector connected to said third ring, and a diode connecting said first ring to said output pad.

17. The semiconductor device of claim 16 wherein said first and second electrostatic protection circuit means comprises a three-terminal PNP transistor for passing electrostatic discharge current from said pad to said second and third conductive rings; said PNP transistor having an emitter connected to said pad, a collector connected to said third conductive ring and a base connected to said second conductive ring.

18. The semiconductor device of claim 17 wherein each of said fourth and fifth lateral transistors of said second conductivity type have an emitter coupled to said input and output pads respectively, a collector connected to said second conductive ring and a base connected to said first conductive ring; and further comprising a lateral transistor of said first conductivity type having its collector connected to said first ring, its emitter connected to third ring and its base coupled to said first ring by said capacitor.

19. The semiconductor device of claim 15 wherein said lateral transistors of said second conductivity type are associated with a MOS transistor having a channel of said second conductivity type and wherein said MOS transistor has a source connected to the collector of its associated lateral transistor, an drain connected to the emitter of its associated lateral transistor and a gate connected to its drain by a capacitor and to its source by a resistor; said capacitor having a value greater than its intrinsic gate to drain capacitance whereby each associated transistor is kick-started into a reverse biased conducting region during an electrostatic discharge event.

* * * * *